(12) United States Patent
Lanteri et al.

(10) Patent No.: US 10,814,545 B2
(45) Date of Patent: Oct. 27, 2020

(54) METHOD FOR ACTIVATING THE SURFACE OF AN ELECTRONICS CARD IN ORDER TO IMPROVE THE ADHERENCE OF A PROTECTIVE LAYER SUCH AS A VARNISH OR AN ELECTRIC, MECHANICAL OR THERMAL BINDER

(71) Applicant: EXELSIUS, Mouans-Sartoux (FR)

(72) Inventors: Alain Lanteri, Carros (FR); Ronan Subileau, Mouans Sartoux (FR); Francis Ferrari, Le Rouret (FR); Mathieu Sarrazy, Grasse (FR)

(73) Assignee: EXELSIUS, Mouans-Sartoux (FR)

( * ) Notice: Subject to any disclaimer, the term of this patent is extended or adjusted under 35 U.S.C. 154(b) by 167 days.

(21) Appl. No.: 15/735,650

(22) PCT Filed: Jun. 15, 2016

(86) PCT No.: PCT/EP2016/063710
§ 371 (c)(1),
(2) Date: Dec. 12, 2017

(87) PCT Pub. No.: WO2016/202836
PCT Pub. Date: Dec. 22, 2016

(65) Prior Publication Data
US 2018/0304524 A1    Oct. 25, 2018

(30) Foreign Application Priority Data

Jun. 19, 2015   (FR) ...................................... 15 55632

(51) Int. Cl.
*B29C 59/14* (2006.01)
*H05K 3/28* (2006.01)
(Continued)

(52) U.S. Cl.
CPC ................. *B29C 59/14* (2013.01); *C08J 7/12* (2013.01); *C08J 7/123* (2013.01); *H05K 3/28* (2013.01);
(Continued)

(58) Field of Classification Search
CPC .. B29C 59/14; C08J 7/12; C08J 7/123; H05K 3/28; H05K 3/381
See application file for complete search history.

(56) References Cited

U.S. PATENT DOCUMENTS 3,309,299 A    3/1967  Mantell
6,551,860 B2*  4/2003  Uner ..................... B23K 1/206
                                                            134/1
(Continued)

FOREIGN PATENT DOCUMENTS

FR    2 854 256 A1    10/2004
WO    2015/020760 A1  2/2015

OTHER PUBLICATIONS

International Search Report for PCT/EP2016/063710 dated Aug. 24, 2016 [PCT/ISA/210].
Written Opinion for PCT/EP2016/063710 dated Aug. 24, 2016 [PCT/ISA/237].

*Primary Examiner* — Michael P Wieczorek
(74) *Attorney, Agent, or Firm* — Sughrue Mion, PLLC

(57) ABSTRACT

The invention relates to a method for treating surfaces of an electronic card (4) by means of a plasma torch (1), said card (4) comprising a plurality of electronic components (C1a, C1b, C1c, C2a, C2b, C3a) and a plurality of surfaces to be treated, arranged at various heights relative to a reference plane (Ref) of the electronic card (4). At least one region to be treated (Zn) containing the surfaces to be treated is determined, strata (S1, S2, S3) which are parallel to said reference plane (Ref) and each contain at least one surface to be treated are determined, and then a torch movement
(Continued)

path is generated such that: the surfaces are treated, stratum by stratum; for each stratum, the torch is exclusively moved in parallel with the reference plane (Ref); during the projection of the plasma flow (2), each treated surface is exclusively placed in the ideal working zone (Pt).

5 Claims, 2 Drawing Sheets

(51) Int. Cl.
     *H05K 3/38*      (2006.01)
     *C08J 7/12*      (2006.01)

(52) U.S. Cl.
     CPC ......... *H05K 3/381* (2013.01); *H05H 2240/10* (2013.01); *H05H 2245/123* (2013.01); *H05K 2201/09972* (2013.01); *H05K 2203/095* (2013.01)

(56) References Cited

U.S. PATENT DOCUMENTS

| | | | |
|---|---|---|---|
| 7,510,664 B2 * | 3/2009 | Carr | B23K 1/206 216/24 |
| 7,819,058 B2 * | 10/2010 | Schmitt | B41J 3/407 101/424 |
| 2003/0087530 A1 | 5/2003 | Carr | |
| 2008/0197533 A1 | 8/2008 | Tsao et al. | |

* cited by examiner

METHOD FOR ACTIVATING THE SURFACE OF AN ELECTRONICS CARD IN ORDER TO IMPROVE THE ADHERENCE OF A PROTECTIVE LAYER SUCH AS A VARNISH OR AN ELECTRIC, MECHANICAL OR THERMAL BINDER

CROSS REFERENCE TO RELATED APPLICATIONS

This application is a National Stage of International Application No. PCT/EP2016/063710 filed Jun. 15, 2016, claiming priority based on French Patent Application No. 15 55632 filed Jun. 19, 2015, the contents of all of which are incorporated herein by reference in their entirety.

The invention primarily relates to the field of methods for treating surfaces of an electronic card, in particular in order to minimize the surface tension of the surfaces treated in this way. The invention also relates to the field of devices for treating surfaces of an electronic card in order to minimize the surface tension of surfaces treated in this way using the device.

BACKGROUND OF THE INVENTION

It is common practice to apply a protective layer, for example a varnish for protecting the card, or an electrical, mechanical or thermal binder, to surfaces of electronic cards. At least some of these card surfaces may be made of polymer materials.

In order to promote the adherence of the varnish or binder layer, it is desirable for it to be applied to a card surface having minimum wettability, i.e. having a predetermined minimum surface tension.

In order to adjust the surface tension, the card may be treated by projecting, onto the one or more surfaces to be treated of the card, a plasma generated using a plasma torch.

Patent document U.S. Pat. No. 3,309,299 describes the use of discharge plasma to treat and increase the wettability of polymers such as electronic card polymers.

It has been observed that it is difficult to obtain a required minimum surface tension over all of the treated surfaces of the card and this may lead to the protective layer or the binder exhibiting adherence defects, which may result in a worsening of the quality of the card obtained in this way.

OBJECT OF THE INVENTION

An object of the present invention is to make it possible to improve the quality of the treatment of electronic card surfaces by plasma stream projection.

SUMMARY OF THE INVENTION

To this end, according to a first aspect of the invention, a method is proposed for treating surfaces of an electronic card using a plasma torch generating a stream of plasma, this card including multiple electronic components, the card having multiple surfaces to be treated that are positioned at various heights with respect to a reference plane of the electronic card, at least some of these surfaces to be treated being formed on at least some of the components of the electronic card. The method according to the invention is primarily characterized in that:

at least one zone to be treated of the electronic card is determined, this zone to be treated containing said surfaces to be treated;

an ideal working range specific to the plasma torch is determined, this working range being localized with respect to a given point of this torch; and using an algorithm run by a computer, strata that are parallel to said reference plane of the card are determined, each of these strata containing at least one of the surfaces to be treated corresponding thereto, then a trajectory for the movement of said torch is generated such that when this movement trajectory is followed:

the surfaces to be treated are treated in a chronological order, consisting in treating all of the surfaces to be treated contained in a given stratum before starting to treat the surfaces to be treated contained in another of the given strata; and such that for each given stratum, the surfaces to be treated contained in this given stratum are treated by moving the torch so that said given point of this torch exclusively follows a planar trajectory that is parallel to the reference plane of the electronic card; and such that at any given instant in time during the projection of the plasma stream onto one of the surfaces to be treated, there is a current portion of the surface to be treated receiving this plasma stream at this given instant in time that is exclusively placed in the predetermined ideal working range.

Each stratum is a virtual volume formed between first and second limit planes of the stratum that are parallel to one another and also parallel to the reference plane of the card. The distance between the first and second limit planes of one and the same stratum define the thickness of this stratum.

Each stratum is determined so as to contain at least one of the surfaces to be treated, stated otherwise, the various surfaces to be treated are distributed between the various strata that have been determined. Thus, considering that several surfaces to be treated may be contained within one and the same stratum, there are at least as many surfaces to be treated as there are strata.

The given point of the torch is a reference point of the torch being used as the origin of a coordinate system of the torch in order to be able to position the torch with respect to the work surface to be treated that is currently being treated while ensuring that this surface that is currently being treated is positioned within the ideal working range specific to the torch. Typically, the given point of the torch may be an endpoint of the nozzle of the torch or any other point of the torch that can be localized.

The method according to the invention makes it possible to analyze the zone to be treated of the card and to identify, in this zone, the sites of the various surfaces to be treated.

The surfaces to be treated identified in this way are distributed in virtual strata, which makes it possible to group the surfaces to be treated together stratum by stratum.

This distribution facilitates the calculation of the trajectory for the movement of the torch, which must treat all of the surfaces to be treated that are located in a given stratum before moving on to the surfaces that are located in another of the strata.

Since the surfaces to be treated of one and the same stratum are treated by moving the torch exclusively along an exclusively planar trajectory, errors in the positioning of the torch with respect to the various surfaces to be treated belonging to this torch are limited. This results in an improved uniformity of treatment of the surfaces to be treated belonging to one and the same given stratum.

Overall, regardless of the stratum in question, because all of the surfaces to be treated of the zone to be treated of the card are treated while they are exclusively positioned within the predetermined ideal working range, the treatment between the surfaces belonging to different strata is made uniform.

This homogenization of the quality of treatment of the various treated surfaces of the electronic card contributes to improving the overall quality of the treatment of the material of the treated card, which may be a polymer material.

This makes it much easier to obtain a required minimum surface tension that is uniform between the various treated surfaces.

The method according to the invention is thus of use in improving the adherence of a protective layer, or of an electrical, mechanical or thermal binder, to the treated surfaces.

This method makes it possible to treat all types of electronic cards that have a plurality of electronic components having surfaces to be treated that are positioned at various heights with respect to a reference plane of the electronic card (some of the surfaces to be treated may be made of a polymer material).

An electronic card may bear electronic components such as one or more electronic modules. Some of these modules may themselves also contain electronic cards to be treated. The treated card may thus belong to a module and be located within a package of the module. The treated card may form part of half-finished or finished electronic products.

According to one particular embodiment of the method of the invention, the working range has a maximum working limit that is located at a predetermined maximum distance Dmax with respect to the given point of this torch and a minimum working limit that is located at a predetermined minimum distance Dmin with respect to said given point of this torch, these predetermined minimum and maximum distances being measured along a working axis of the torch passing through said given point of this torch.

Typically, the chosen working range extends over less than 10 mm. In the case in which the given point of the torch is located at the end of the nozzle, the maximum distance Dmax is 20 mm measured along the working axis of the torch (the working axis is the main axis of the plasma stream projected by the torch) and the minimum distance Dmin is therefore equal to the value Dmax minus the range length. Thus, Dmin is 10 mm measured along the working axis, from the given point of the torch.

According to a second aspect of the invention, a device suitable for implementing the method according to the invention in accordance with any one of the embodiments of this method is also proposed.

More particularly, the invention relates to a device for treating surfaces of an electronic card, including:
support means that are suitable for supporting an electronic card including multiple electronic components that are positioned at various heights with respect to a reference plane of the electronic card;
a plasma torch generating a plasma stream;
means for the relative movement of the torch with respect to the support means bearing an electronic card;
memorization means in which the following are stored:
1) first data that are representative of the position of at least one zone to be treated of the electronic card, and of respective positions of surfaces to be treated that are formed on at least some of the electronic components and contained within this zone to be treated;
2) second data that are representative of the position, with respect to a given point of this torch, of an ideal working range specific to this plasma torch; and
3) an algorithm.

This surface treatment device additionally includes a computer that is suitable for running said algorithm and, in response to the running of this algorithm, for:
determining strata that are parallel to said reference plane of the card, each surface to be treated being contained in one of these strata corresponding thereto; then
generating a trajectory for the movement of said torch implemented using the movement means and such that:
the surfaces to be treated are respectively treated by the projection of the plasma stream in a chronological order, consisting in treating all of the surfaces to be treated contained in a given stratum before starting to treat the surfaces to be treated contained in another of the given strata; and such that
for each given stratum, the surfaces to be treated contained in this given stratum are treated by moving the torch so that said given point of this torch exclusively follows a planar trajectory that is parallel to the reference plane of the electronic card; and such that
at any given instant in time during the projection of the plasma stream onto one of the surfaces to be treated, there is a current portion of the surface to be treated receiving this plasma stream at this given instant in time that is exclusively placed in the predetermined ideal working range.

When it is used for treating an electronic card, this device of the invention makes it possible to obtain the aforementioned advantages of the method according to the invention.

BRIEF DESCRIPTION OF THE DRAWINGS

The invention will be better understood upon reading the following description of non-limiting embodiments provided with reference to the figures of the appended drawings, in which.

DETAILED DESCRIPTION OF THE INVENTION

Figure 2A:
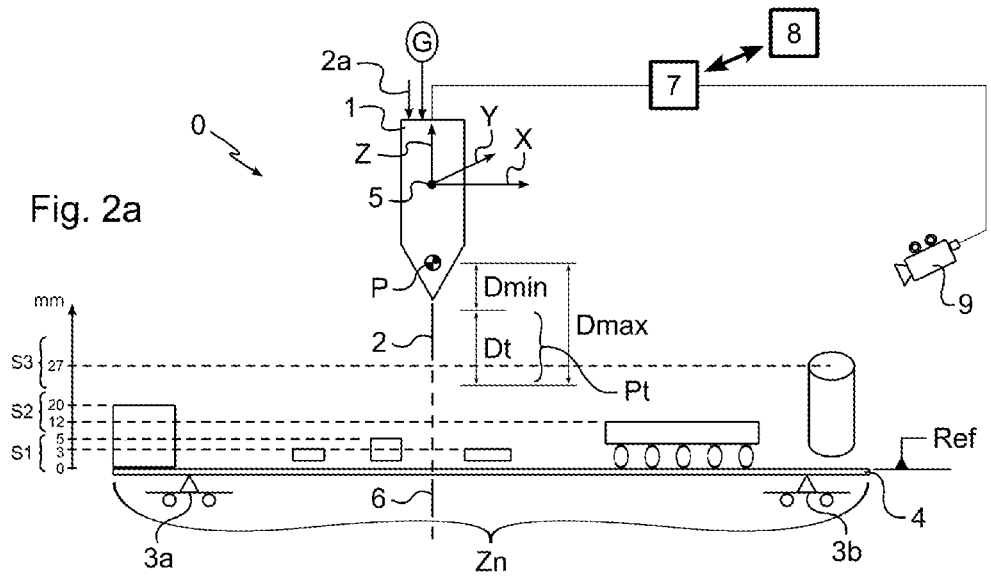
FIGS. 2a, 2b 2c and 2d illustrate the device according to the invention when it implements the method of the invention.
Figure 2B:
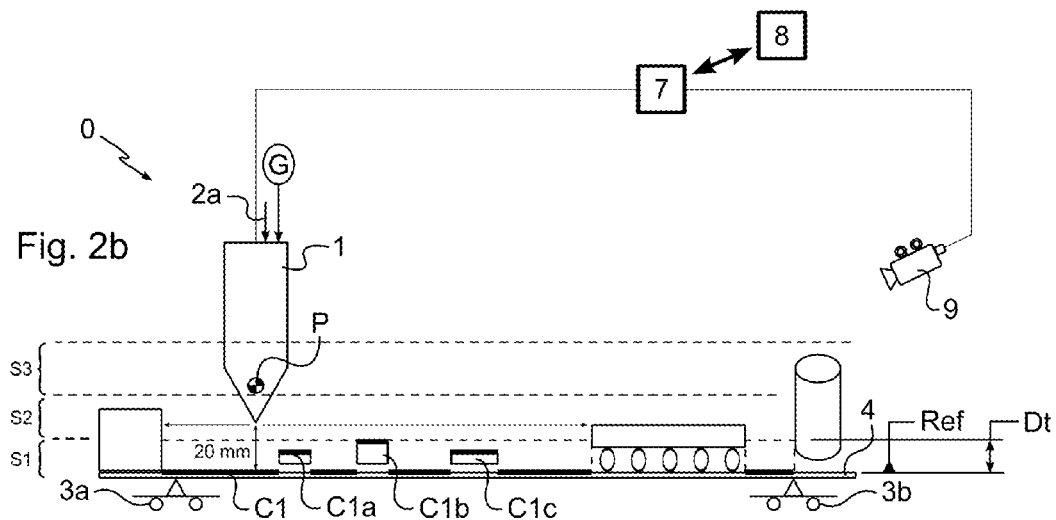
Figure 2C:
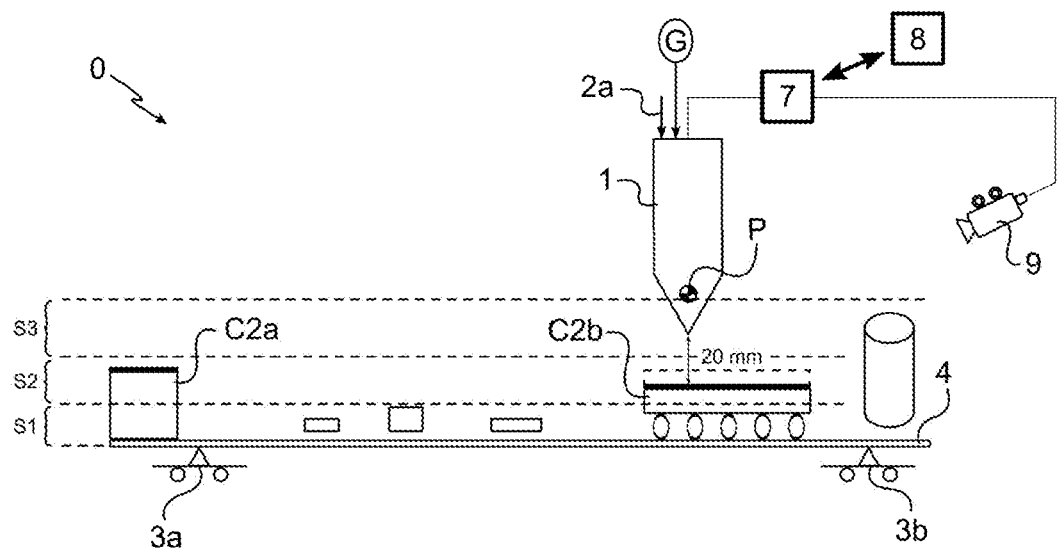
Figure 2D:
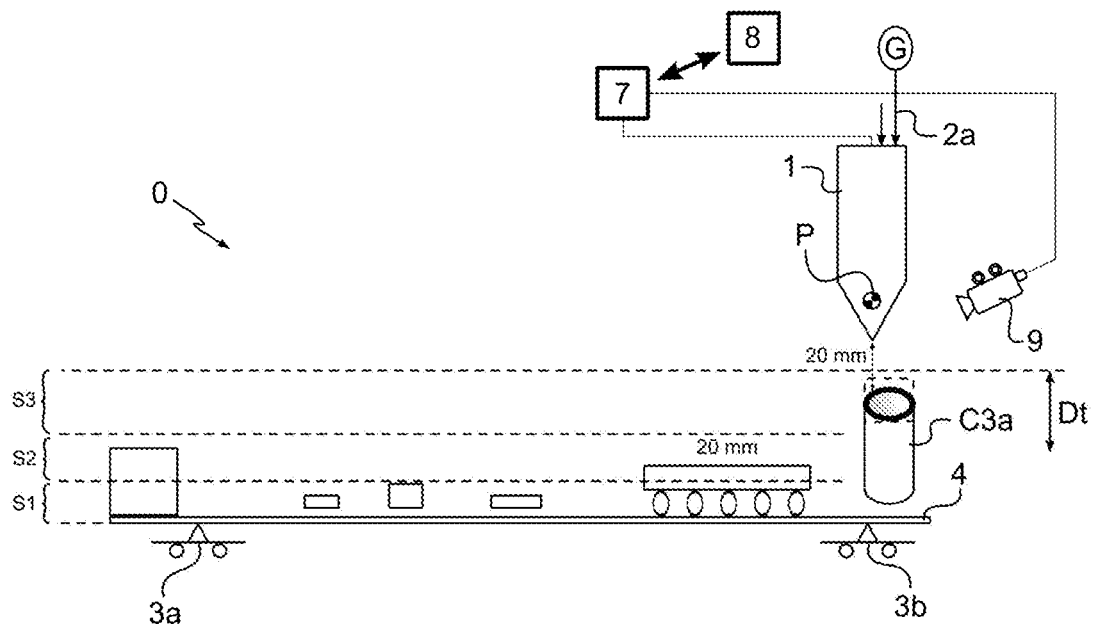

As mentioned above, the invention relates to a method for treating surfaces that belong to an electronic card and are positioned at various heights with respect to a reference plane Ref of the card 4. The treated surfaces are illustrated by thick lines in FIGS. 2b, 2c and 2d. Some of the treated surfaces may be made of polymer material.

This surface treatment is carried out using a plasma torch 1 generating a plasma stream 2, of blown-arc plasma, also called atmospheric plasma, type.

One type of plasma torch 1 that may be used to implement this method is for example shown in the patent document U.S. Pat. No. 3,309,299.

As can be seen in particular in FIGS. 2a, 2b, 2c and 2d, the device 0 according to the invention includes an atmospheric plasma torch 1 that is fed with gas, for example air, nitrogen or another gas, via a duct 2a and supplied with electricity via a power supply source G.

The power supply G is linked to electrodes (not shown) of the torch 1 in order to generate an alternating electric field between these electrodes and thus form a plasma between these electrodes. Means for regulating a gas flow rate (not shown) are linked to the duct 2a in order to control a flow rate of air passing between the electrodes so as to generate a plasma stream 2 at the outlet of a nozzle of the torch 1. The gas may also be purified before being taken in by the torch via a filter and processing control. Typically, the goal is that the air taken in has no particles larger than 0.1 µm, that its dew point is below +3° C. and that it has no more than 0.012 mg/m$^3$ of oil residue. The pressure of this gas may be regulated and will preferably be between 3 and 5 bar. The torch may be provided with quick-release air connections and pluggable electrical connections in order to make it easier to replace the torch. The gas flow rate may be chosen to be at least equal to 30 L/min, preferably between 40 and 60 L/min, preferably 50 L/min.

The gas flow rate and/or the electrical power supply frequency and/or the intensity of this power supply are regulated in order to make it possible to regulate the dimensions and the position of the ideal working range with respect to the given point P of the torch. This regulation may be carried out via the computer described below. The cross section of the working range may also be determined according to the cross section of the plasma flow at the outlet of the torch.

The device 0 also comprises support means 3a and 3b that are suitable for supporting an electronic card 4. This card 4 includes multiple electronic components C1a, C1b, C1c, C2a, C2b, C3a, each having surfaces to be treated that are respectively positioned at various heights with respect to a reference plane Ref of the electronic card 4, as well as C1-type zones to be treated, which correspond to the surface of the resist varnish of the electronic card and which extend along the main plane of the card, which is also referred to as the reference plane Ref. The device of the invention 0 also comprises means 5 for the relative movement of the torch 1 with respect to the support means 3a, 3b that bear the electronic card 4.

One example of movement means 5 may include a first motorized axis (not shown) bearing the torch in order to move it along an axis Z that is perpendicular to the reference plane Ref of the card, a second motorized axis (not shown) for moving the torch 1 along an axis X that is parallel to said reference plane Ref and a third motorized axis (not shown) for moving the torch 1 along an axis Y that is parallel to said reference plane Ref and perpendicular to the axis X.

These three motorized axes are controlled by the computer (potentially via a regulating controller) in order to allow the torch to be moved along the three axes X, Y, Z, which are orthogonal to one another. The motorized axes are such that regardless of the trajectory of the torch, its working axis 6 always stays in the same orientation with respect to the reference plane Ref. In this instance the working axis 6 of the torch 1 remains perpendicular to the plane Ref regardless of the trajectory for the movement of the given point P of the torch with respect to this reference plane Ref.

It should be noted that this working axis 6 is fixed with respect to the torch and passes through a given point P of this torch, which is used as a reference point of this torch 1. This given point may constitute the origin of the coordinate system X, Y, Z.

According to another example, in which the movement means always include first, second and third motorized axes, the torch may be borne solely by the first motorized axis for moving the torch along the axis Z, which is always perpendicular to the reference plane of the card. These second and third motorized axes are linked to the support means 3a and 3b of the card. The second motorized axis moves the card with respect to the torch along an axis that is parallel to the reference plane Ref. The third motorized axis moves the card with respect to the torch along another axis that is parallel to the reference plane Ref. These second and third motorized axes here form a bench for moving the card in a plane that is parallel to the reference plane Ref. The movement means used to implement the invention could include at least one robot including at least three axes or multiple robots in parallel.

The device 0 also includes sensors for detecting a relative position of the given point P of the torch 1 with respect to the electronic card 4 and, in particular, the relative position of this given point of the torch with respect to the reference plane Ref of the card 4. These sensors (not shown) may be incorporated within the motorized axes.

Said sensors are linked to the computer 7 of the device 0 so as to make it possible to compute, using information arising from said sensors, the relative position of the torch with respect to the card.

The computer 7 is also suitable for running an algorithm that is stored in the memorization means 8, which are themselves linked to said computer 7.

First data that are representative of the position of at least one zone to be treated of the electronic card, and of respective positions of surfaces to be treated that are formed on at least some of the electronic components and contained within this zone to be treated are stored in these memorization means 8.

It should be noted that these first data that are representative of the position of said at least one zone to be treated of the electronic card and of the respective positions of the surfaces to be treated may be obtained on the basis of a topographical scan of the card and/or on the basis of a file representing the card in space.

As can be seen in FIGS. 2a to 2d, a topographical scan of the card is carried out using optical means 9 for observing the card 4. In this instance, one of the optical means may be:
 a telemeter, such as a laser telemeter; and/or
 a camera and/or
  multiple cameras that are arranged so as to obtain a three-dimensional representation of all or some of the card in which the zone Zn to be treated and the surfaces to be treated, as well as the reference plane of the card, can be located.

In one embodiment, a human-machine interface that is linked to the computer displays a representation of the card to the operator, which representation may include a photograph of the card and a representation of the topographical scan of the card. The operator may thus, with the aid of the display, recognize and locate surfaces to be treated of the card and potentially redefine the zone in which the surfaces to be treated are located. Ideally, a photograph of the card obtained via a camera and a representation of the topographical scan of the card illustrating heights of points on the card measured, for example, using laser telemetry are superposed over this representation of the card.

Alternatively, or in addition to the preceding embodiment in which a representation of the card is displayed, on the basis of the topographical scan of the card, an automatic shape-recognition algorithm may be run by the computer in order to recognize and automatically locate surfaces to be treated of the card. In one particular embodiment, the surface that is recognized and located automatically by the computer may be displayed via the human-machine interface in order to allow the operator either to confirm the surfaces to be treated that are recognized and located by the computer or to manually modify these surfaces to be treated via the human-machine interface.

It should be noted that the topographical scan may consist of a three-dimensional matrix of points.

Second data that are representative of the relative position of an ideal working range Pt specific to this plasma torch with respect to the given point P of this torch 1 are also stored in these memorization means 8.

It should be noted that these second data that are representative of the relative position of the ideal working range Pt may be deduced using a database indicating the position of the ideal working range Pt with respect to the given point of the torch according to measurements of parameters that are representative of the operation of the torch, such as the speed of the airflow at the outlet of the torch and/or the frequency and the power of the electrical power supply that is delivered to the electrodes of the torch.

In an additional response to the running of the algorithm by the computer, the computer:

determines strata S1, S2, S3 that are parallel to said reference plane Ref of the card, each surface to be treated being contained in one of these strata corresponding thereto; then it generates a trajectory for the movement of said torch that it implements using the movement means 5.

This movement trajectory is such that:

the surfaces to be treated are respectively treated by the projection of the plasma stream in a chronological order, consisting in treating all of the surfaces to be treated contained in a given stratum before starting to treat the surfaces to be treated contained in another of the given strata; and that for each given stratum S1, S2, S3, the surfaces to be treated contained in this given stratum are treated by moving the torch so that said given point P of this torch 1 exclusively follows a planar trajectory that is parallel to the reference plane Ref of the electronic card 4; and that at any given instant in time during the projection of the plasma stream 2 onto one of the surfaces to be treated, there is a current portion of the surface to be treated receiving this plasma stream 2 at this given instant in time that is exclusively placed in the predetermined ideal working range Pt.

As may be seen in FIGS. 2a to 2d, the card 4 includes multiple electronic components, each having at least one surface to be treated; these surfaces to be treated of the card are positioned at various heights with respect to a reference plane Ref.

The zone Zn to be treated of the electronic card here extends over the entire card 4.

The surfaces to be treated that belong to the zone to be treated are distributed over three strata S1, S2, S3 that are parallel to one another and to the reference plane Ref of the card.

The first stratum S1 extends from 0 to 8 mm above the reference plane and contains surfaces to be treated that are formed over the components C1a, C1b and C1c, the respective heights of which are 0 mm, 3 mm, 5 mm and 3 mm.

The second stratum S2 extends from 12 to 20 mm above the reference plane Ref and contains surfaces to be treated that are formed over the components C2a and C2b, the respective heights of which are 12 mm and 20 mm.

The third stratum S3 extends from 20 to 28 mm above the reference plane Ref and contains surfaces to be treated that are formed over the component C3a, the height of which is 27 mm.

It should be noted that mutually adjacent strata may touch or be at a distance from one another if there is no surface to be treated between these adjacent strata.

Here, the thickness of the ideal working range Pt of the torch is from 8 to 10 mm. This thickness is given in FIG. 2a by the distance Dt and is defined between a first plane that is located at a distance Dmin from the given point P of the torch 1 and a second plane that is located at a distance Dmax from this given point P. These first and second planes are parallel to the reference plane Ref.

The torch 1 moves vertically with respect to the reference plane Ref (movement along the axis Z parallel to the working axis 6) in order to successively cover the surfaces of the stratum S1, then the surfaces of the stratum S2, then the surfaces of the stratum S3 while ensuring that any treated surface at a given instant in time is positioned within the working range Pt of the torch.

When the calculated movement trajectory is followed:

the surfaces to be treated are treated one stratum after another; and all of the surfaces contained within one and the same stratum are treated by moving the torch only along a planar trajectory that is parallel to the reference plane of the electronic card, i.e. without distancing the torch or bringing the torch closer with respect to the reference plane Ref.

Figure 1:
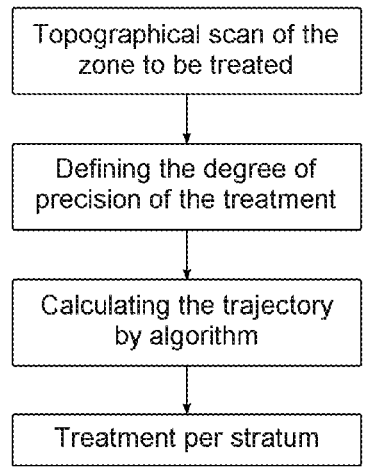
FIG. 1 illustrates a succession of steps that are implemented in accordance with the method of the invention.

FIG. 1 illustrates the steps that are successively implemented during the execution of the method according to the invention by the device 0.

As mentioned above, the first step consists in carrying out a topographical scan of the card and more particularly of the zone to be treated.

The second step consists in defining the degree of precision of the treatment, i.e. the optimum working range Pt of the torch. The smaller this range Pt, the higher the degree of precision of the treatment.

The next step consists in calculating the trajectory for the movement of the torch by running the algorithm. During this second step, the algorithm first determines the positions and thicknesses of the strata with respect to the plane Ref. These strata are determined both according to the desired degree of precision of the treatment, i.e. according to the value Dt determining the extent and the position of the optimum working range Pt, and according to the positions of the surfaces to be treated (these surfaces to be treated have been identified via the topographical scan of the zone to be treated).

This movement trajectory is composed of a single planar trajectory per stratum to be covered and of multiple linking trajectories.

Thus, at least some of the planar trajectories of the movement trajectory are linked to one another by linking trajectories, each linking trajectory including at least one linking trajectory portion extending in a direction that is perpendicular to said reference plane Ref (parallel to the working axis 6).

When changing stratum, moving the given reference point P of the torch perpendicularly to the reference plane Ref makes it possible to rapidly disengage the treated surface from the ideal working range Pt in which the plasma stream 2 is at its most powerful.

The order in which the planar trajectories are followed may be determined:

either to favor the optimization of the speed at which the movement trajectory is followed overall rather than the precision of the treatment;

or to favor the optimization of the precision of the treatment rather than the speed at which the movement trajectory is followed overall.

The human-machine interface may be arranged to allow the operator to select either the optimization of the speed at which the movement trajectory is followed overall or the optimization of the precision of the treatment.

The movement trajectory is then calculated according to the choice made by the operator.

In the example of FIGS. 2a to 2d, there are three planar trajectories to be defined, one for each stratum S1, S2 and S3, each planar trajectory being determined according to parameters relating to the overlap of adjacent passes, the target speed of movement of the torch, the target acceleration of movement of the torch and according to a desired minimum lateral distance between the projected plasma stream and components of the electronic card. Here, it is assumed that over the entire working range Pt, the stream 2 takes a form of a straight cylinder, the diameter of which is comprised between 10 mm and 13 mm and preferably between 11 and 12 mm.

The degree of overlap, which is the width of the surface covered by two adjacent passes, is comprised between 90 and 100% of the stream diameter at the distance Dmax. Here, a degree of overlap of 10 mm is typically chosen.

Each planar movement trajectory is also determined so as to optimize the time taken to treat the surfaces to be treated of each stratum. It is also possible for at least one of the starting point and the endpoint of a given planar trajectory to be imposed so as to impose a linking trajectory for the engagement and/or a linking trajectory for the disengagement of the torch with respect to the treated stratum.

Between two immediately successive planar trajectories, a linking trajectory is placed, starting at a point of disengagement from the first of these planar trajectories and ending at a point of engagement with the second of these planar trajectories.

Each of the planar trajectories and each linking trajectory is calculated by taking account of the target accelerations at the start and end of the trajectory (here, the target accelerations along the axes X and Y are 12.5 m/s-2 and 4.5 m/s-2 along the axis Z) and by taking account of the masses and inertias of the torch and of the motorized axes (here, the mass of the torch is less than 650 grams).

Here, the predetermined ideal working range, as well as properties of the plasma stream 2 and properties of each of the planar trajectories that are used to treat the surfaces to be treated contained in the determined strata, are selected so as to obtain a surface tension of at least 46 mN/m after treatment of said surfaces to be treated of the electronic card.

A method used to determine the ideal working range of the plasma torch will now be explained.

This ideal working range is predetermined/deduced by carrying out:

a) a series of successive tests consisting, for each test, in projecting a plasma stream onto at least one sample that is at least partially composed of a material to be treated, such as a polymer material, and, during this series of tests, at least one of the test parameters chosen from a list of test parameters is varied, this list comprising:

the speed of movement of the torch with respect to the sample;
the distance separating a reference point of the torch used for the test and a sample surface treated with this torch used for the test;
a speed of projection of the plasma stream;
a projection cross section of the plasma stream;
a degree of overlap between two adjacent passes of the projection of this plasma stream;
a frequency of the electrical power supply between electrodes of the torch;
a power of the electrical power supply between electrodes of the torch;
a value that is representative of a quality of the air taken in by the torch in order to generate the plasma stream; then, after carrying out this series of tests b) a series of measurements are carried out in order to measure values that are representative of surface tensions associated with treated surfaces of the samples treated during the series of tests; then, after carrying out this series of measurements;

c) at least one set of optimum test parameter values that is considered to be suitable for obtaining a desired minimum surface tension of the treated surface is memorized, each at least one set of optimum test parameter values containing at least one optimum value of the distance separating a reference point of the test torch and a surface treated with this test torch, at least some of said at least one set of optimum test parameter values being used to define said at least one predetermined ideal working range.

Stated otherwise, plasma stream projection parameters are varied during the plurality of tests, which parameters influence the surface tensions of the surfaces of the samples thus treated. Next, the surface tensions on the surfaces thus treated are measured and one or more sets of optimum values that make it possible to obtain a desired minimum level of surface tension are selected. Since each set of parameters contains at least one optimum value of the surface of separation, using one or more of these optimum values of the surface of separation, it is possible to deduce the ideal working range of the torch when the latter is used to treat a given surface under given operating conditions.

Typically, any test that makes it possible to obtain a desired minimum level of surface tension is associated with a set of test parameters that are chosen for carrying out this test, which set comprises at least one optimum value of the distance separating a reference point of the test torch and a surface treated with this test torch during this test.

It is therefore known that the optimum working range for this test torch (which allows, for example, a satisfactory treatment of the polymer material thus treated) contains at least the optimum value of the distance separating a reference point P of the test torch and the surface treated with this test torch during this test.

According to a first simplified approach, it may be assumed that the optimum working range for this torch is a working zone extending between first and second planes that are perpendicular to a working axis of this torch passing through said given point of this torch. The first of these planes is located at a distance from said given point of the torch that is equal to said optimum value of the distance of separation plus a first predetermined tolerance value.

The second of these planes is located at a distance from said given point P of the torch that is equal to said optimum value of the distance of separation minus a second predetermined tolerance value.

According to a second approach, the first and second planes that delimit the optimum working range are defined by moving the torch while uniformly varying the distance separating a reference point of the torch used for the test and the surface of the sample treated with this torch.

The distance of separation from the first plane delimiting the optimum working range is that measured at the instant in time of the test at which, for the first time, it is observed that the quality of treatment is satisfactory (i.e. that the surface tension is at least equal to a target threshold).

The distance of separation from the second plane delimiting the optimum working range Pt is that measured at the instant in time of the test at which, for the last time, it is observed that the quality of treatment is satisfactory.

Typically, it is assumed that the outer limit of the working range is defined by a cylindrical or slightly conical surface, of which the working axis 6 of the torch 1 constitutes a director axis, the radius of this cylindrical surface being predetermined.

This radius may for example be determined during the series of tests and in this case, it may constitute one of the parameters of the set of parameters.

By virtue of the invention, it is possible to treat the electronic card in order to increase the surface tension thereof while considerably limiting the risk of damaging the card during this treatment.

The invention claimed is:

1. A method for treating surfaces of an electronic card using a plasma torch generating a stream of plasma, the card including multiple electronic components, the card having multiple surfaces to be treated that are positioned at various heights with respect to a reference plane of the electronic card, at least one or more of the surfaces to be treated being formed on at least one or more of the components of the electronic card, wherein:

at least one zone to be treated of the electronic card is determined, the at least one zone to be treated containing the multiple surfaces to be treated;

a working range for to the plasma torch is determined, the working range being localized with respect to a point of the torch; and using an algorithm run by a computer, strata that are parallel to said reference plane of the card are determined, each of the strata containing at least one of the multiple surfaces to be treated, and generating a trajectory for movement of said torch such that when the trajectory for movement is followed:

the multiple surfaces to be treated are treated in a chronological order, comprising treating all surfaces of the multiple surfaces to be treated contained in a stratum of the strata before starting to treat other ones of the multiple surfaces to be treated contained in another stratum of the strata; and such that for each stratum, the surfaces to be treated contained in the stratum are treated by moving the torch so that said point of the torch exclusively follows a planar trajectory that is parallel to the reference plane of the electronic card; and such that at any instant in time during the projection of the plasma stream onto one of the multiple-surfaces to be treated, there is a portion of the one of the multiple surfaces to be treated receiving the plasma stream that is placed in the determined working range.

2. The method for treating surfaces as claimed in claim 1, in which the working range has a maximum working limit that is located at a predetermined maximum distance with respect to the given point of the torch and a minimum working limit that is located at a predetermined minimum distance with respect to said given point of the torch, the predetermined minimum and maximum distances being measured along a working axis of the torch passing through said given point of the torch.

3. The method as claimed in claim 1, in which at least two of the planar trajectories of the trajectory for movement are linked to one another by linking trajectories, each linking trajectory including at least one linking trajectory portion extending in a direction that is perpendicular to said reference plane.

4. The method as claimed in claim 1, in which the determined working range is selected and control of the plasma stream and of each of the planar trajectories that are used to treat the surfaces to be treated contained in the determined strata is carried out so as to obtain a surface tension of at least 46 mN/m after treatment of said surfaces to be treated of the electronic card.

5. The method as claimed in claim 1, in which the determined working range is deduced by carrying out:
  a) a series of successive tests comprising, for each test, projecting a plasma stream with a test torch onto at least one sample that is at least partially composed of a material to be treated and, during the series of tests, at least one test parameters chosen from a list of test parameters is varied, the list of test parameters comprising:
    a speed of movement of the test torch with respect to the sample;
    a distance separating a reference point of the test torch and a sample surface treated with the test torch;
    a speed of projection of the plasma stream;
    a projection cross section of the plasma stream;
    a degree of overlap between two adjacent passes of the projection of this plasma stream;
    a frequency of the electrical power supply between electrodes of the test torch;
    a power of the electrical power supply between the electrodes of the test torch;
    a value that is representative of a quality of air taken in by the test torch in order to generate the plasma stream; then, after carrying out the series of tests
  b) a series of measurements are carried out in order to measure values that are representative of surface tensions associated with treated surfaces of the samples treated during the series of tests; then, after carrying out the series of measurements;
  c) at least one set of optimum test parameter values for obtaining a desired minimum surface tension of the treated surface is memorized, each of the at least one set of optimum test parameter values containing at least one optimum value of the distance separating a reference point of the test torch and a surface treated with the test torch, at least some of said at least one set of optimum test parameter values being used to define said determined working range.

* * * * *